United States Patent [19]

Cote et al.

[11] Patent Number: 4,956,313
[45] Date of Patent: Sep. 11, 1990

[54] VIA-FILLING AND PLANARIZATION TECHNIQUE

[75] Inventors: William J. Cote, Essex Junction; Carter W. Kaanta, Colchester; Michael A. Leach, Winooski; James K. Paulsen, Jericho, all of Vt.

[73] Assignee: International Business Machines Corporation, Armonk, N.Y.

[21] Appl. No.: 257,117

[22] Filed: Oct. 11, 1988

Related U.S. Application Data

[63] Continuation of Ser. No. 85,836, Aug. 17, 1987, abandoned.

[51] Int. Cl.$^5$ .................. H01L 21/321; H01L 21/304
[52] U.S. Cl. ................................. 437/203; 437/195; 437/228; 156/636; 156/645
[58] Field of Search ............... 437/189, 195, 225, 228, 437/203, 187; 156/643, 636, 645; 357/67, 71

[56] References Cited

U.S. PATENT DOCUMENTS

| | | | |
|---|---|---|---|
| 2,933,437 | 4/1960 | Loosme | 204/15 |
| 4,076,860 | 2/1978 | Kuroda | 427/91 |
| 4,470,874 | 9/1984 | Bartush et al. | 156/643 |
| 4,475,981 | 10/1984 | Rea | 156/636 |
| 4,520,041 | 5/1985 | Aoyama et al. | 427/88 |
| 4,614,021 | 9/1986 | Hulseweh | 29/590 |
| 4,614,563 | 9/1986 | Kubo | 156/643 |
| 4,702,792 | 10/1987 | Chow et al. | 156/628 |
| 4,708,767 | 11/1987 | Bril | 437/18 |
| 4,789,648 | 12/1988 | Chow et al. | 437/225 |

FOREIGN PATENT DOCUMENTS 0223920 10/1985 European Pat. Off. .
59-165427 9/1984 Japan .

OTHER PUBLICATIONS

Beyer et al., "Glass Plananrization Stop-Layer Polishing," *IBM TDB*, vol. 27, No. 8, Jan. 1985, pp. 4700, 4701.

*Primary Examiner*—Brian E. Hearn
*Assistant Examiner*—T. N. Quach
*Attorney, Agent, or Firm*—Mark F. Chadurjian

[57] ABSTRACT

A method of forming a plurality of conductive studs within a non-planar insulator layer (e.g., PSG or BPSG) disposed between a first series of conductive structures arranged on a substrate and metal lines formed on the upper surface of the insulator layer. Vertical vias are defined through the insulator layer to expose at least one of the first conductive structures on the substrate. A conformal metal layer (e.g., CVD W) is deposited on the insulator layer to fill the vias. Then, the metal layer and the insulator layer subjected to a polish etch in the presence of an abrasive slurry, to remove portions of the metal layer outside of the vias while simultaneously planarizing the insulator layer.

10 Claims, 3 Drawing Sheets

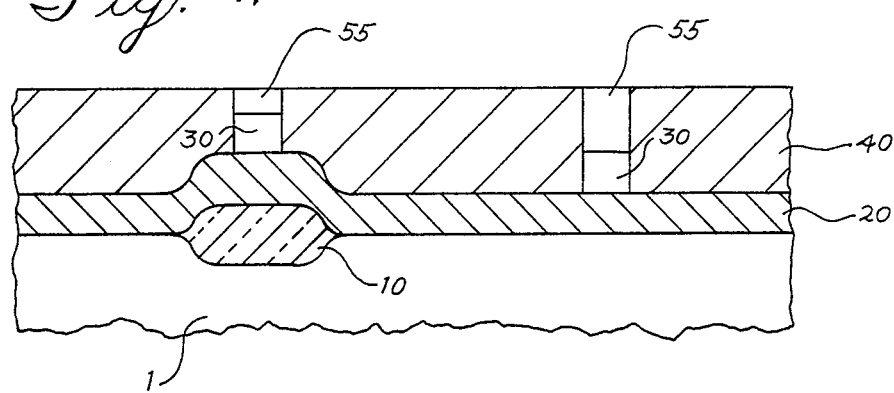
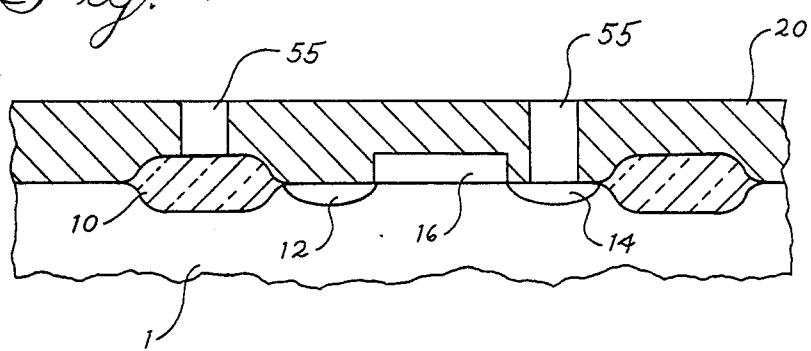

VIA-FILLING AND PLANARIZATION TECHNIQUE

This is a continuation of co-pending application Ser. No. 85,836 filed on Aug. 17, 1987 now abandoned.

CROSS REFERENCE TO RELATED APPLICATIONS

Reference is made to co-pending U.S. Patent Application Ser. No. 791,860, entitled "Chem-Mech Polishing Method for Producing Co-Planar Metal/Insulator Films on a Substrate", filed Oct. 28, 1985, by Beyer et al and assigned to the assignee of the present invention. This patent application relates to a method for producing co-planar metal/insulator films on a substrate according to a chemical-mechanical (chem-mech) polishing technique. The invention is particularly directed to the fabrication of planarized multi-level metal semiconductor structures by maximizing the polishing rate ratio of insulator:metal or metal:insulator.

Reference is also made to co-pending U.S. Patent Application Ser. No. 031,809, entitled "Method of Improving Silicon-On-Insulator Uniformity", filed Mar. 30, 1987, now U.S. Pat. No. 4,735,674, by J. B. Lasky and assigned to the assignee of the present invention. This patent application is directed to depositing a layer of tungsten on a patterned silicon layer, and polishing the silicon layer back until it is relatively co-planar with the deposited tungsten layer.

TECHNICAL FIELD

The present invention is directed to simultaneously planarizing metal and insulator films so as to form planarized, filled vias.

BACKGROUND ART

As the device densities of integrated circuits continue to increase, the metallurgy technologies utilized to interconnect individual devices must meet more stringent requirements. For one, higher device counts necessitate multiple levels of metallurgy. As the number of metal layers increases, it is important that the insulator layers separating these metal layers be as planar as possible. If planarity is not maintained, the resulting severe topologies may cause metal opens or shorts.

Another constraint placed upon state-of-the-art metallurgy technologies is that the vias utilized to interconnect the metal layers must be formed in as small a space as possible. This is commonly accomplished by anisotropically patterning the insulator (e.g., by reactive ion etching (RIE) in a fluorine-based gaseous plasma) to form vias having vertical sidewalls.

Yet another constraint is the minimization of contact resistance. Because of the sheer number of devices to be connected at the first level of metal, the resistive load on (and hence the signal delays associated with) this metal level will increase. Interconnect materials that minimize contact resistance will decrease loading. Refractory metals such as tungsten have been shown to possess the requisite resistivity properties. Moreover, because CVD tungsten can be conformally deposited to fill vertical-walled vias formed in an insulator layer, the previously-mentioned via density constraint can also be met by the adoption of CVD tungsten as the interconnect material.

Prior art approaches have attempted to provide a planarized insulating layer having planarized studs imbedded therein. U.S. Pat. No. 4,470,874, entitled "Planarization of Multi-Level Interconnected Metallization System" (issued Sept. 11, 1984, to Bartush et al and assigned to the assignee of the present invention) discloses a process wherein aluminum-based studs are formed on a substrate, a glass passivation layer is deposited to cover the stud, a planarizing photoresist layer is deposited on the passivation layer, the photoresist layer is exposed to an etchant that removes the photoresist layer and the glass passivation layer at substantially the same rate, and residual amounts of the glass passivation layer are removed in an etchant that attacks the previously-formed interconnect studs and the glass passivation layer at substantially the same rate. Note that this latter etchant, is disclosed as being an argon-based sputter etch, an ion milling step or a polishing step.

U.S. Pat. No. 4,614,021, entitled "Pillar Via Process" (issued Sept. 30, 1986, to Hulseweh et al and assigned to Motorola) discloses a process wherein a first level of metal is defined on a substrate, interconnecting stud structures are defined on the first metal layer, a thick passivation layer is deposited to cover the conductive studs, a planarizing resist layer is coated on the dielectric layer, and the resist layer is exposed to an etchant that removes the resist and the passivation layer at substantially the same rate so as to planarize the passivation layer.

In the prior art it is also known to coat a dielectric layer on a substrate, defined vias in the dielectric layer, fill the vias with metal, coat the structure with a planarizing resin layer, and expose the resin layer to an etchant that removes the resin as well as portions of the metal layer outside the vias at substantially the same rate. Such processes are disclosed in U.S. Pat. No. 4,520,041, entitled "Method for Forming Metallization Structure Having Flat Surface on Semiconductor Substrate" (issued May 28, 1985, to Aoyama et al and assigned to Toshiba) and U.S. Pat. No. 4,614,563, entitled "Process for Producing Multi-Layer Conductor Structure" (issued Sept. 30, 1986, to Kubo and assigned to Fuji Photo Film Company). In both processes, a metal:resin etch rate ratio of 1:1 must be maintained in order to provide a planar surface. Moreover, note that in both patents the portions of the metal laying outside the vias are disposed on a relatively planar passivation layer.

As shown in FIG. 3 of the above-mentioned co-pending U.S. Patent Application Ser. No. 791,860, another planarization method consists of planarizing the passivation layer prior to via definition, and then overfilling the subsequently-formed vias with metal. Portions of the metal lying outside the vias are then removed by polishing. More specifically, the application discloses (at Table 1) a plurality of acidic chem-mech slurries that maximize the polishing rate of aluminum relative to silicon oxide.

The present inventors investigated the possibility of planarizing the passivation film after via definition and prior to metal deposition. If vias are defined in a pre-planarized passivation layer, the underlying topography will produce vias of grossly varying depths. If the etch process is continued so as to fully define the deepest vias, the more shallow vias will be greatly overetched and the underlying structures may be substantially eroded. At the same time, because of the abovementioned vertical via and contact resistance constraints, the inventors wanted to utilize a conformal metal as the via-filling metallurgy. However, none of the abovementioned prior art techniques specifically address simultaneously planarizing a via-filling metal and a non-planar insulator layer so as to form a planarized metal-insulator surface.

SUMMARY OF THE INVENTION

It is thus an object of the invention to provide a planarized metal-insulator surface.

It is another object of the invention to planarize the passivation film after via definition.

It is yet another object of the invention to provide a process for simultaneously planarizing a tungsten film and an insulator layer without the use of a separate planarization layer.

The above and other objects of the present invention are realized by a method of forming a plurality of conductive studs within a non-planar insulator layer disposed between a first series of conductive structures arranged on a substrate and a second series of conductive structures formed on the insulator layer. Vias are defined through the insulator layer so as to expose one or more of the plurality of first conductive structures. A conductive layer is deposited on the insulator layer so as to overfill the vias formed in said insulator layer. Then, both of the conductive layer and the insulator layer are planarized to remove portions of the conductive layer outside the vias while simultaneously planarizing the insulator layer.

BRIEF DESCRIPTION OF THE DRAWING

The foregoing and other structures and teachings of the present invention will become more apparent upon a description for carrying out the best mode thereof. In the description to follow, reference will be made to the accompanying Drawing, in which:

FIGS. 1-4 are cross-sectional views of a semiconductor substrate undergoing the process steps in accordance with the method of the present invention;

FIG. 7 is a cross-sectional view of a semiconductor substrate undergoing a process in accordance with a second embodiment of the present invention.

DESCRIPTION OF THE BEST MODE FOR CARRYING OUT THE INVENTION

Figure 1:
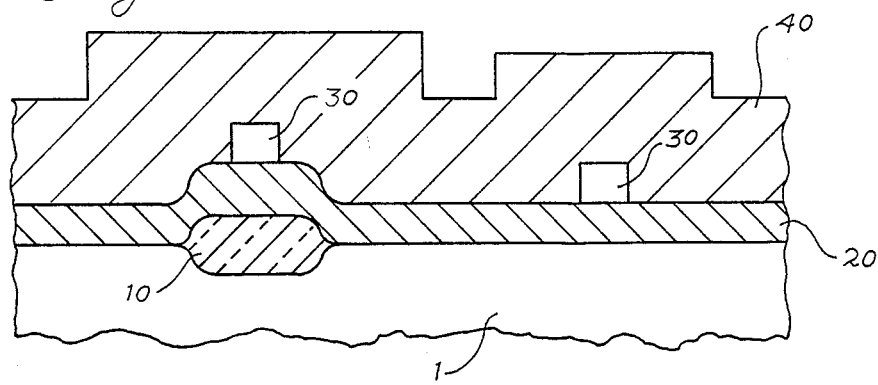

With reference to FIG. 1, the process of the present invention is carried out on a semiconductor substrate 1. For example, substrate 1 is made of p-type, <100> oriented monocrystalline silicon. The substrate is shown as being devoid of integrated circuit structures except for the semirecessed oxide isolation region 10. In practice, a plurality of diffusion regions are formed within the upper surface of the substrate, and a plurality of conductive structures (e.g., poly-crystalline silicon gate electrodes, storage node electrodes, etc.) are provided on the surface of the substrate 1 to form integrated circuit devices. Such devices are not shown in FIGS. 1-4 for ease of illustration. The semi-recessed oxidation structure 10 can be formed using conventional techniques, such as growing a thin layer of silicon oxide on the substrate, depositing a layer of silicon nitride on the silicon oxide layer, patterning the nitride-oxide layers to expose a region of the substrate, and oxidizing the exposed substrate regions.

After the integrated circuit structures (e.g., isolation structure 10) are formed on the substrate, a first passivation layer 20 is deposited. The passivation layer 20 can be any one of a number of known insulating materials, such as polyimide phosphosilicate glass (PSG), or borophosphosilicate glass (BPSG). A layer of metal is then deposited on the first passivation layer 20, and is patterned to form metal lines 30. While the metal layer can be any conductive material, it is preferred to form the metal lines 30 from an aluminum-based alloy such as Al/2%Cu or Al/4%Si/2%-Cu. The metal lines 30 can be defined by anisotropically etching portions of the metal layer exposed by a photoresist in a chlorine-based gaseous plasma.

After the metal lines 30 have been defined, a second passivation layer 40 is deposited on the substrate. It is preferred to form the second passivation layer 40 from a doped glass (preferably BPSG). Note that the second passivation layer 40 has an uneven upper surface as deposited. That is, because doped glass passivation layers tend to be conformal, the upper surface thereof follows the contours producing by the underlaying structures formed on the substrate.

Figure 2:
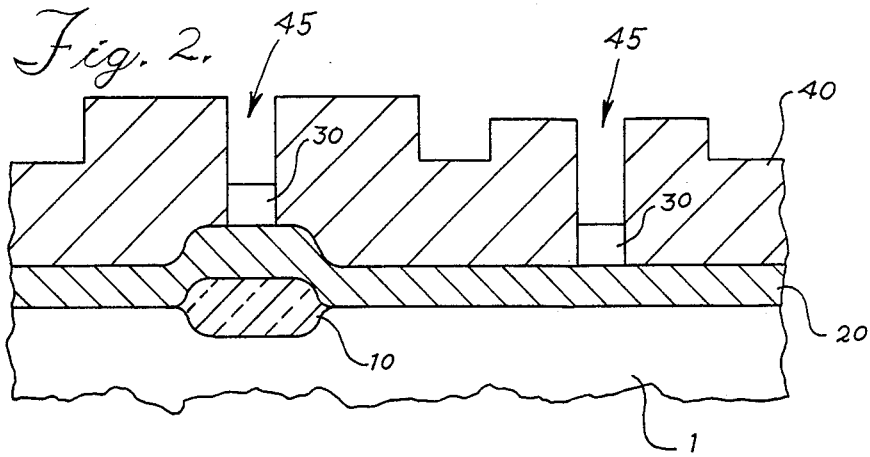

As shown in FIG. 2, vias 45 are then formed in the second passivation layer 40 so as to expose the underlying metal lines 30. Vias 45 can be formed by depositing and patterning a conventional photoresist material, and anisotropically etching the exposed portions of the second passivation layer 40 in a halogen-based gaseous plasma such as CF$_4$. Because the upper surface of the second passivation layer 40 follows the topology produced by the underlying layers, the vias will be of equal depth. It will take the same amount of etching to completely define all of the vias 45 above the metal lines 30. The above process thus avoids the deleterious effects produced by overetching shallow vias during the definition of deeper vias as was done in prior processes in which the passivation layer was planarized prior to via definition.

Figure 3:
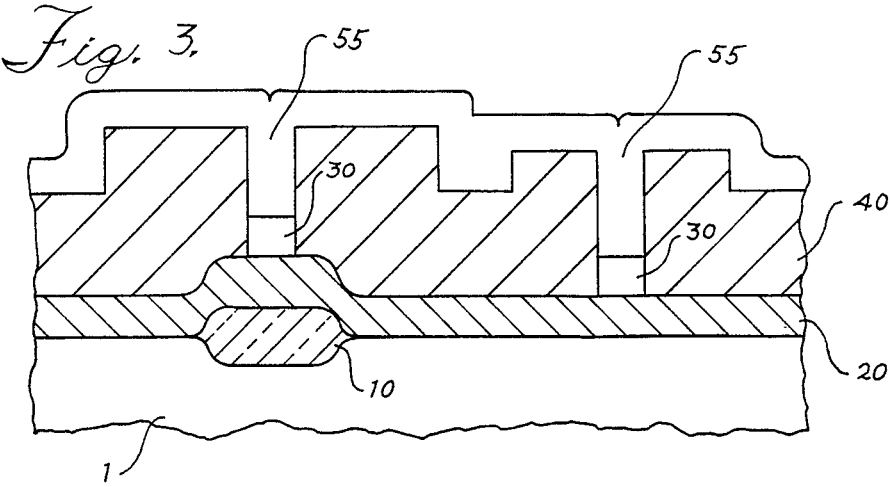

Then, as shown in FIG. 3, a second metal layer 50 is deposited on the patterned passivation layer 40. It is preferred to form the second metal layer 50 of a material than can be conformally deposited to fill the vias in the second passivation layer 40 without creating voids. It has been found that chemical vapor deposited (CVD) tungsten provides these properties. Note that because the second metal layer 50 is conformal, its upper surface follows the topology produced by the underlying structures. The second metal layer 50 should be at least thick enough (i.e., at least one-half the width of the vias in the cross-sectional dimension shown) to completely fill the vias 45 formed in the second passivation layer 50. The portions 55 of second metal layer 50 lying within the vias thus provide an electrical connection to metal lines 30.

Then, as shown in FIG. 4, the metal layer 50 and passivation layer 40 are exposed to a planarization etch that removes portions of the metal layer 50 lying outside the vias while simultaneously planarizing the passivation layer. Thus, the resulting structure provides a planarized surface 60 upon which subsequent metal and insulator layers can be deposited.

Figure 5:
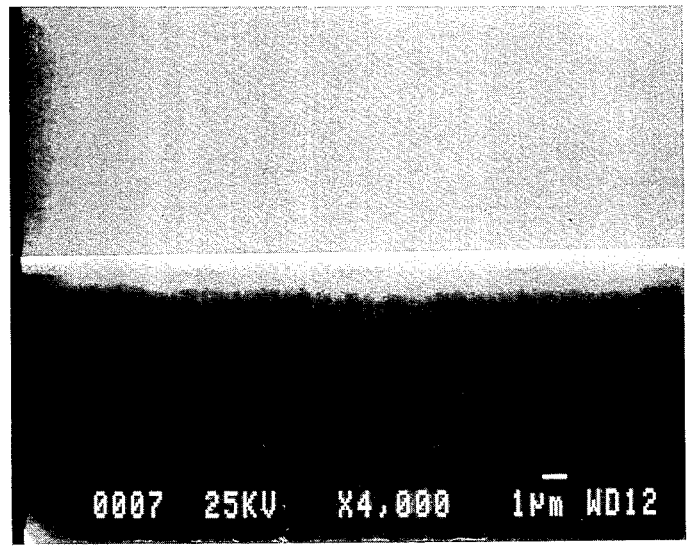
FIG. 5 is an SEM of a semiconductor substrate showing the results of the polish step of the present invention.
Figure 6:
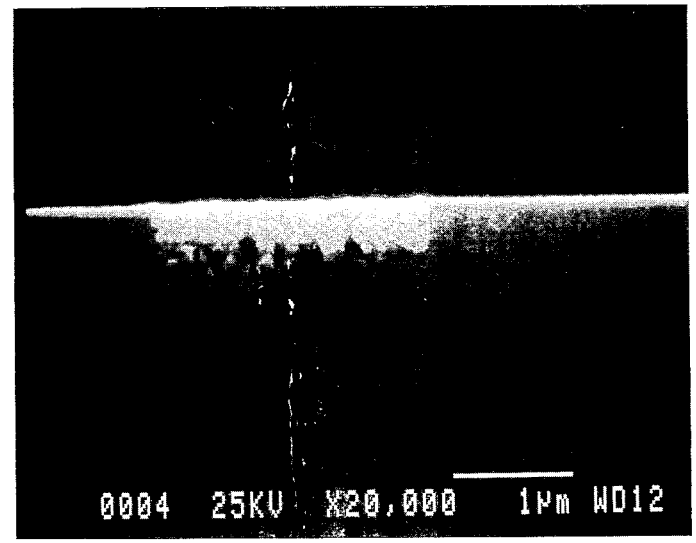
FIG. 6 is an SEM of a section of the substrate shown in FIG. 5.

In the invention, this planarization etch is practiced by polishing the layers in the presence of an abrasive slurry. Experiments were carried out on a Strasbaugh single wafer polish tool. An abrasive SUBA IV perforated polishing pad was used. The pad was held at a pressure of approximately 10–12 psi. It was found that an abrasive slurry consisting of $Al_2O_3$ particulates, deionized water, a base, and an oxidizing agent will provide W:BPSG etch rates sufficient to produce a planar surface. Forty grams of $Al_2O_3$ particulates were mixed with ten liters of deionized water and approximately one liter of hydrogen peroxide (an oxidizing agent). In one experiment nitric acid was added to produce a slurry having a pH of 6. In another experiment, no acid/base was added. In a third experiment, potassium hydroxide was added to produce a slurry having a pH of about 8.4. At a pH of 6 or 7, no tungsten was removed. At a pH of 8.4, approximately 300 Å/minute of tungsten and 200 Å/minute of BPSG were polished away. The results of this process are illustrated by a scanning electron microscope (SEM) photograph of an experimental structure as shown in FIG. 5. The experimental structure was prepared by depositing a thick BPSG layer on a wafer, etching apertures into the thick layer of BPSG, coating CVD tungsten on the BPSG, and carrying out the above-described polishing process. The small boxes are the tungsten-filled apertures in BPSG. Note the total planarity of the upper surface. FIG. 6 shows a section of the substrate shown in FIG. 5 at a magnification of 5X. Note that the polishing process does not produce any delamination of the tungsten grains from the BPSG apertures. Further experiments in which the pH of the slurry was raised to 11 and above produced substantially the same results. That is, the polishing process produces a planar BPSG/W surface at higher W:BPSG etch rate ratios (e.g., 10:1 and higher). Thus, the present invention presents a planarization process that is much more flexible (and thus more reliable) than prior art processes that rely on both a 1:1 etch rate ratio between metal and a planarizing resin and a pre-planarized passivation surface. In the invention, an $Al_2O_3$/water/oxidizing agent slurry having a pH above approximately 7.5 will provide a planarized tungsten-BPSG surface.

Thus, a planarized metal-insulator surface is formed after metal is deposited in vias having equal depth. Via-filling metallization technologies can be used to provide a planarized surface without producing overetched via holes. The resulting planarized surface yields a host of advantages. Because the metal above the filled vias is totally removed, undesired coupling between filled vias is eliminated. When a second metal layer is subsequently deposited on the planarized surface for interconnection, the photoresist layer used to pattern the layer will be deposited on a planar surface, enhancing the coverage of the photoresist. Moreover, after patterning the metal through this photoresist, the parasitic capacitance associated with the respective metal layers decreases, because the distance between the "plates" of the parasitic capacitors decreases due to enhanced planarity. The resistance of the metal lines will also decrease due to planarity. In general, the resulting planarized surface is more compatible with high density IC's in which multiple layers of metal are needed for interconnection.

Although the invention has been shown and described with reference to forming conductive studs to a first layer of metal, it is compatible with any metal level. As shown in FIG. 7, the invention can be used to simultaneously form a metal line over the isolation region 10 and a contact to a diffusion region 14 of an FET device having another diffused region 12 and a gate electrode 16.

Moreover, while conformal metal layers such as tungsten are preferred, metal layers other than tungsten can be used. For example, assuming no hole-fill problems, conductive materials such as the above-mentioned aluminum-based alloys can be used to fill the vias. As discussed in the above-cited U.S. Patent Application Ser. No. 791,860, aluminum and silicon oxide can be polished at approximately the same rate by using a Rodell 210 I2 polish pad at 2-8 psi in the presence of a slurry consisting of aluminum particulates and deionized water (one gram/liter).

Finally, while various modifications may occur to a person of ordinary skill in the art upon review of the foregoing teachings, such modifications fall within the ambit of the present invention as exemplified in the following claims.

We claim:

1. A method of forming a plurality of conductive studs within an insulator layer disposed between a first series of conductive structures arranged on a substrate and a second series of conductive structures formed on an upper surface of the insulator layer, comprising the steps of:

forming the insulator layer on the substrate, the insulator layer having a non-planar upper surface;

defining vias through said non-planar upper surface of the insulator layer, so as to expose at least one of said plurality of first conductive structures disposed on the substrate;

depositing a conductive layer on said non-planar upper surface of the insulator layer, said conductive layer completely filling said vias to contact said one of said plurality of first conductive structures, said conductive layer having a non-planar upper surface that substantially follows the topology of said non-planar upper surface of the insulating layer; and then subjecting both of said non-planar upper surface of said conductive layer and said non-planar upper surface of the insulator layer to a single polish etch step in the presence of an abrasive slurry, so as to remove portions of said conductive layer laying outside of said apertures in the insulator layer while simultaneously removing appreciable portions of said non-planar upper surface of the insulator layer so as to establish planarity in said upper surface of the insulator layer.

2. The method of claim 1, wherein said conductive layer comprises a conformal metal.

3. The method as recited in claim 2, wherein said conformal metal comprises chemical vapor deposited tungsten.

4. The method as recited in claim 3, wherein said insulator layer is comprised of a doped glass.

5. The method as recited in claim 4, wherein said abrasive slurry is comprised of alumina particulates, deionized water, a base, and an oxidizing agent.

6. The method as recited in claim 5, wherein said oxidizing agent comprises hydrogen peroxide.

7. The method as recited in claim 6, wherein said slurry has a pH above approximately 7.5.

8. The method as recited in claim 1, wherein said conductive layer is comprised of an aluminum-based alloy, and wherein said insulator layer is comprised of doped glass.

9. The method as recited in claim 7, wherein said slurry is comprised of alumina particulates and deionized water.

10. A method of forming a plurality of conductive studs within a doped glass layer disposed between a first series of conductive structures arranged on a substrate and a second series of conductive structures formed on an upper surface of the passivation layer, comprising the steps of:

- depositing the doped glass layer on the substrate, the doped glass layer having a non-planar upper surface;
- defining vias in said non-planar upper surface of the doped glass layer, so as to expose one or more of said plurality of first conductive structures on said substrate, said vias having substantially vertical sidewalls;
- defining a conformal metal layer on said non-planar upper surface of the doped glass layer, said conformal metal layer filling said vias in the doped glass layer, said conformal metal layer having a non-planar upper surface that substantially follows the topology of said non-planar upper surface of the doped glass layer;
- subjecting both of said non-planar upper surface of said conformal metal layer and said non-planar upper surface of the doped glass layer to a single polish etch step in the presence of a basic abrasive slurry, so as to remove portions of the conformal metal layer outside of said vias in the doped glass layer while simultaneously removing appreciable portions of said non-planar upper surface of the insulator layer so as to establish planarity in said upper surface of the doped glass layer.

* * * * *